United States Patent
McDougall et al.

(10) Patent No.: US 7,248,048 B2
(45) Date of Patent: Jul. 24, 2007

(54) APPARATUS FOR MAGNETIC RESONANCE IMAGING

(75) Inventors: Ian Leitch McDougall, Oxon (GB); Peter Hanley, Gloucestershire (GB)

(73) Assignee: Oxford Instruments PLC, Oxford (GB)

( * ) Notice: Subject to any disclaimer, the term of this patent is extended or adjusted under 35 U.S.C. 154(b) by 0 days.

(21) Appl. No.: 10/554,940

(22) PCT Filed: Apr. 30, 2004

(86) PCT No.: PCT/GB2004/001861

§ 371 (c)(1),
(2), (4) Date: Oct. 31, 2005

(87) PCT Pub. No.: WO2004/097443

PCT Pub. Date: Nov. 11, 2004

(65) Prior Publication Data

US 2006/0202695 A1    Sep. 14, 2006

(30) Foreign Application Priority Data

Apr. 30, 2003   (GB) ................... 0309926.4

(51) Int. Cl.
*G01V 3/00*    (2006.01)
(52) U.S. Cl. ..................... 324/319; 335/299
(58) Field of Classification Search ................ 324/319, 324/320; 335/299

See application file for complete search history.

(56) References Cited

U.S. PATENT DOCUMENTS

| | | | |
|---|---|---|---|
| 5,250,901 A | 10/1993 | Kaufman et al. | |
| 5,307,039 A * | 4/1994 | Chari et al. | ................. 335/299 |
| 5,717,333 A | 2/1998 | Frese et al. | |
| 5,814,993 A * | 9/1998 | Frese et al. | ................. 324/319 |
| 5,864,236 A * | 1/1999 | Li | ......................... 324/320 |
| 6,064,290 A | 5/2000 | Xu et al. | |
| 6,255,929 B1 | 7/2001 | Xu et al. | |

OTHER PUBLICATIONS

Yao Takeshi, Abstracts of Japan, "Magnetic Resonance Imaging Device", Publication No. 2000-083921, Publication Date: Mar. 28, 2000.
A copy of the PCT International Preliminary Report on Patentability dated Nov. 2, 2005.

* cited by examiner

*Primary Examiner*—Louis M. Arana

(57) ABSTRACT

An apparatus for magnetic resonance imaging includes a first magnet for generating a first magnetic field and a second magnet for generating a second magnetic field, dissimilar to the first magnetic field, the second magnet being spaced apart from the first magnet. The apparatus is arranged such that the first and second magnets cooperate to generate a substantially homogeneous magnetic field defining a working region wherein the first and second magnetic fields are arranged asymmetrically with respect to the working region, and wherein at least part of the working region is positioned within the first magnet or between the first and second magnets.

23 Claims, 9 Drawing Sheets

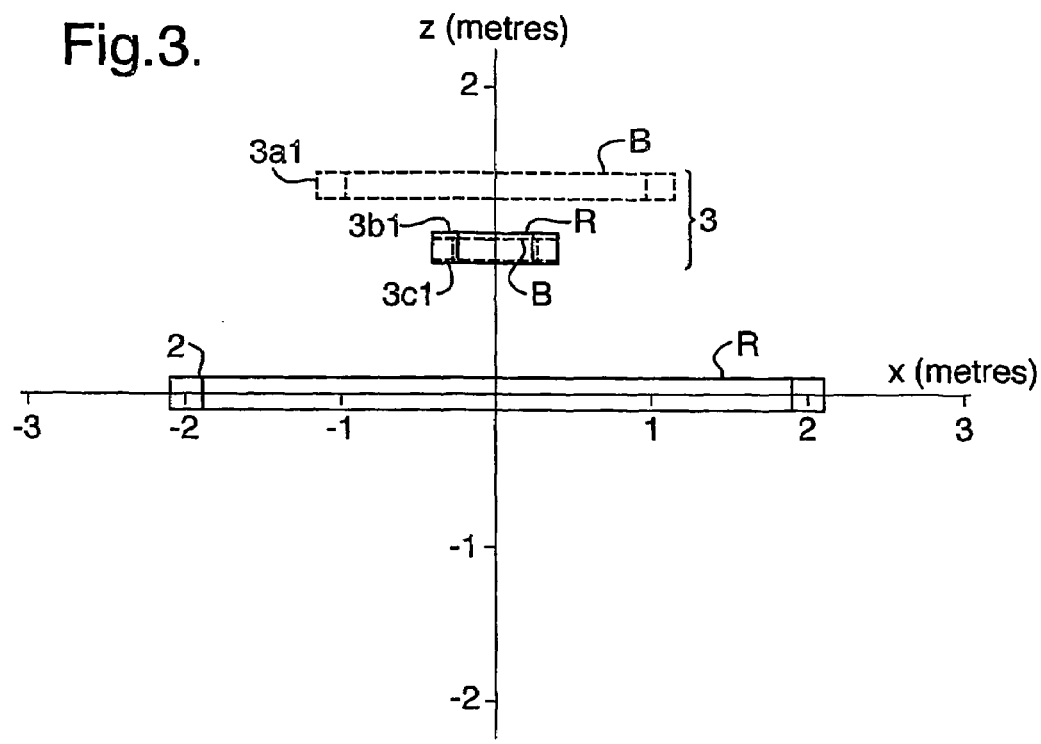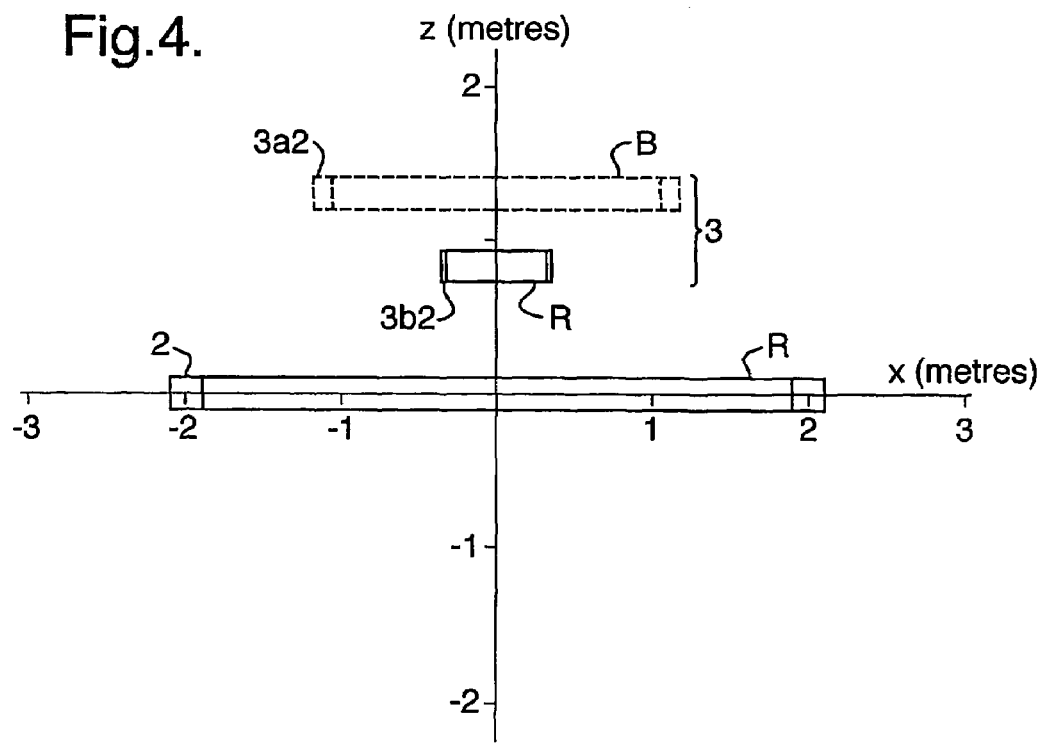

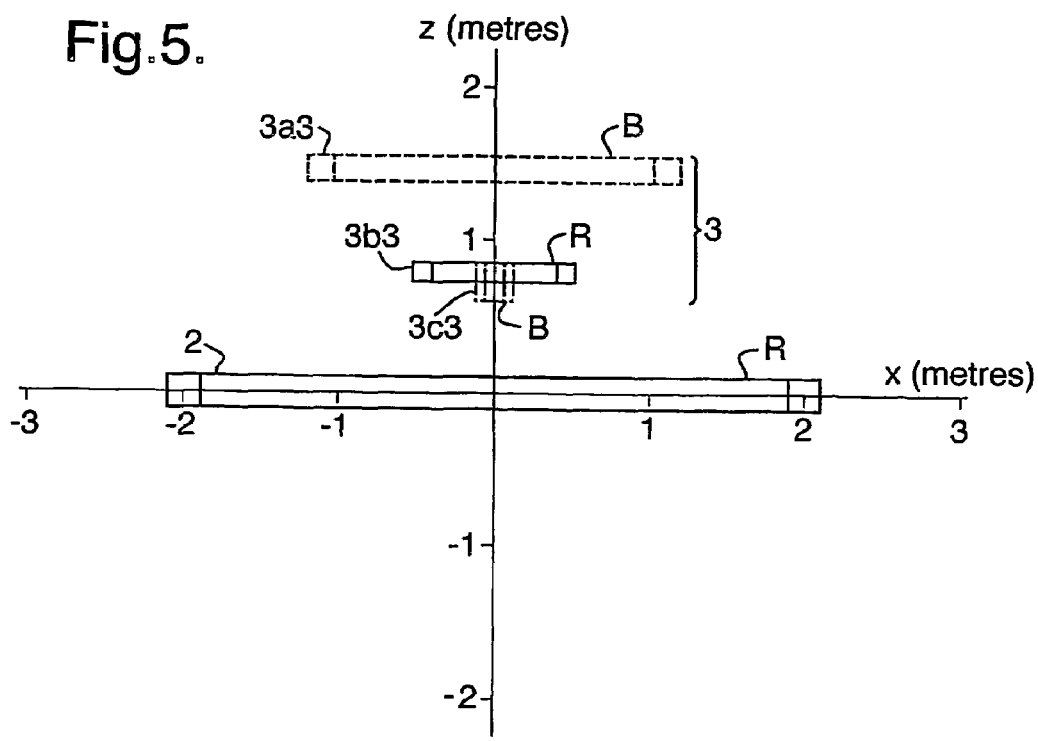
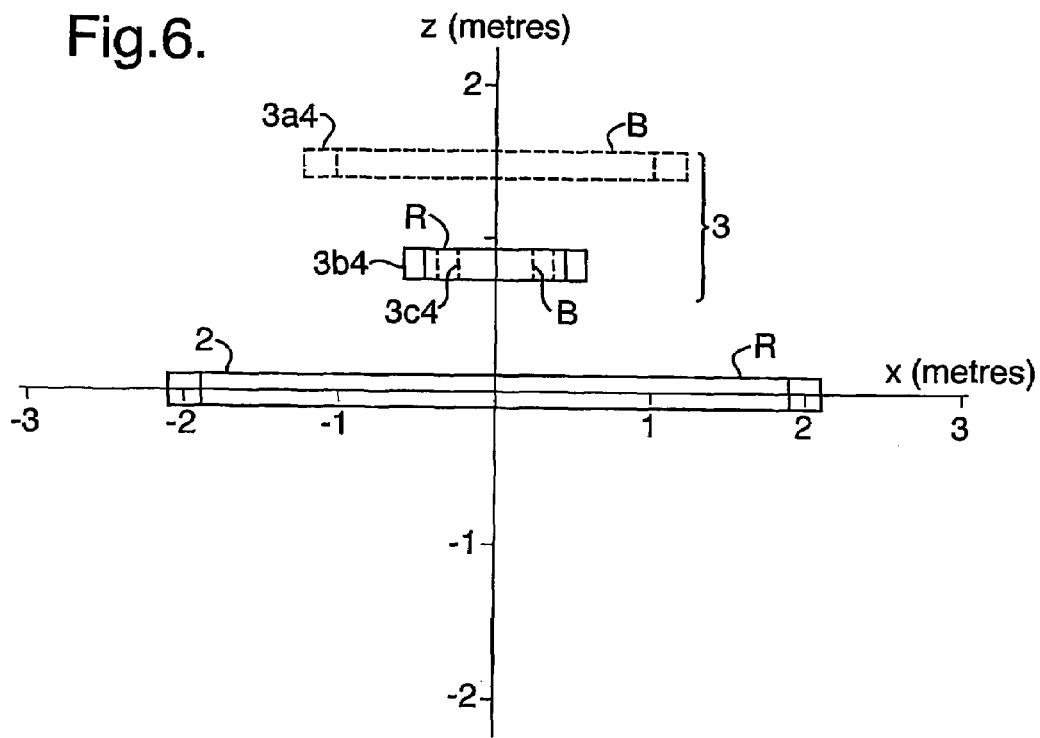

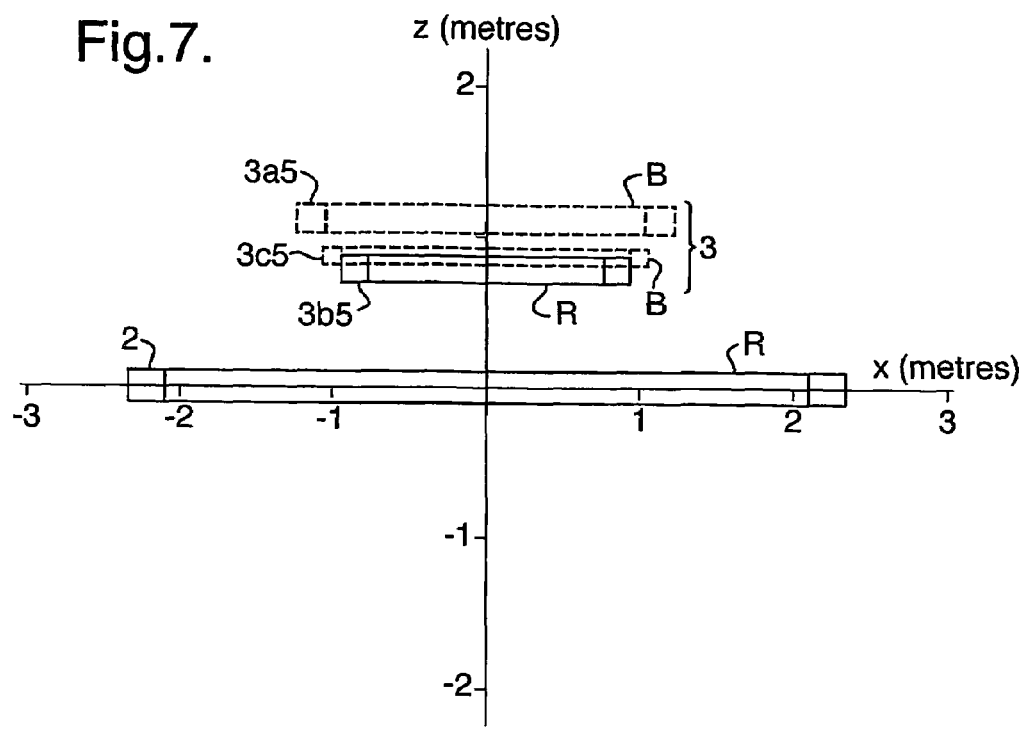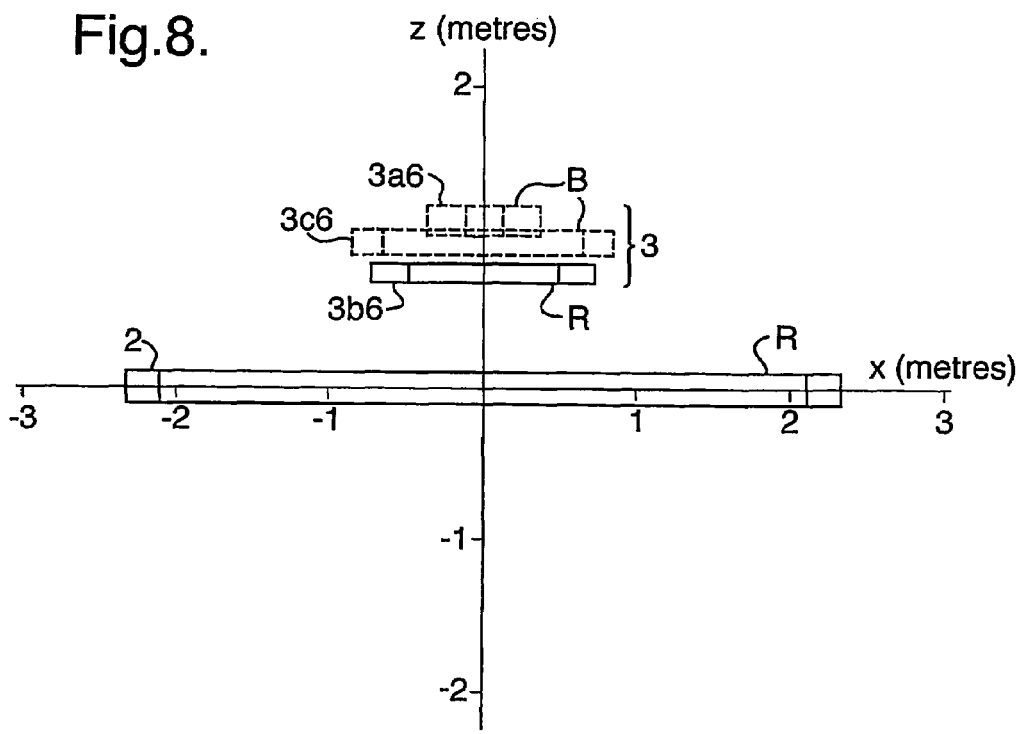

APPARATUS FOR MAGNETIC RESONANCE IMAGING

The present invention relates to apparatus for magnetic resonance imaging.

Magnetic resonance imaging is now a well established technique in the field of diagnostic medicine. In known systems, typically a subject is placed within a confined tubular solenoid magnet and magnetic resonance imaging (MRI) is performed by generating a region of substantially homogenous magnetic field in the body of the subject. Images are then obtained from the tissues within this region by the stimulation of nuclear resonances.

Such tubular solenoid magnet systems typically have small bores which are capable of only just accommodating a human subject. This causes a problem in that it is difficult to move the patient with respect to the substantially homogeneous region. Although modern magnet systems attempt to alleviate this by producing large regions of near homogeneity, typically the best imaging results are only obtained in the centres of such regions where the homogeneity is greatest. For example it is difficult to image the shoulder of a patient accurately since this always lies to the side of such a region.

In addition, some tissue types (such as tendons) require the tissue to be placed at a particular angle to the magnetic field in order to obtain an image. Such manoeuvring is largely prevented within known magnets by the confined space within the bore. A further problem directly resulting from this is that the small magnet bore often causes feelings of unease (claustrophobia) in many patients.

To date, magnetic resonance imaging apparatus has thus provided a powerful tool but its use is extremely limited outside the field of diagnosis because of the difficulties in producing such homogenous working regions other than in the internal environment of a tubular magnet. There is a strong desire to address these problems by the provision of more "open access" systems in which the confinement problems of the prior art are reduced.

However, the greatest advantage of open access MRI is that it would provide the much sought after ability to perform real-time imaging actually during medical procedures.

In accordance with the invention, we provide an apparatus for magnetic resonance imaging, comprising:— a first magnet for generating a first magnetic field; and a second magnet for generating a second magnetic field dissimilar to the first magnetic field, the second magnet being spaced apart from the first magnet, wherein the apparatus is arranged such that the first and second magnet cooperate to generate a substantially homogeneous magnetic field defining a working region wherein the first and second magnetic fields are arranged asymmetrically with respect to the working region, and wherein at least part of the working region is positioned within the first magnet or between the first and second magnets.

From a careful consideration of the physics of magnet systems, we have realised that it is possible to generate a substantially homogenous magnetic field where such a region is generated by first and second magnets which are spaced apart from one another. The substantially homogeneous magnetic field defines a working region suitable for magnetic resonance imaging.

The asymmetry within the system provides inventive advantage over known systems, as does the use of dissimilar magnetic fields, since these allow the positioning of the substantially homogeneous region in the manner described.

Physical asymmetry in the arrangement of the first and second magnets may be provided by the positioning of the first or second magnets only on a particular side of the working region. The first and second magnets may also be provided each only upon opposed sides of the working region. Even if the working region is positioned halfway between the first and second magnets, asymmetry is provided by the dissimilar fields.

One or each of the first or second magnetic fields may be asymmetrical with respect to its corresponding magnet. The first and second fields therefore combine to produce a resultant field which is preferably asymmetric with respect to the working region and/or one or each of the first or second magnets. The asymmetry in the magnetic field in question (first, second or resultant) may be manifested in the field strength, direction or gradient.

Typically the first magnet provides the main field, albeit with some inhomogeneities. In this case the separate second magnet provides a correction field to correct the inhomogeneities in part of the main field so as to generate the working region of substantially homogeneous field, suitable for MRI. Either of each of the first and second magnets may comprise an array of magnets.

The invention allows the magnetic working region to be centred within the first magnet or indeed, between the first and second magnets. The first and second magnets may therefore lie separately "above" and "below" an MRI subject. Alternatively, the subject may be positioned within the first magnet with the second being positioned further away, such as beneath the subject.

Where the first and second magnets are spaced apart so as to define a volume, the volume is typically arranged such that the centres of the first and second magnets are positioned at the boundaries of the volume and in this case at least part of the working region is therefore positioned within the volume. In some cases the volume may be bounded by planes which are characteristic of the first and second magnets, these planes containing the centres of the first and second magnets respectively.

Preferably it is the centre of the working region which lies within the region defining the volume and indeed apart from when the working region is centred within the first magnet, in other cases, the working region is normally fully contained within the volume.

In general the majority of the magnetic field strength within the working region is generated by the first magnet acting as a main magnet which produces an inhomogeneous field. The second magnet is typically used to correct the inhomogeneities by the superposition of one or more further magnetic fields so as to generate a region in which a substantially homogeneous field suitable for MRI is generated.

The use of a second spaced magnet allows for movement of the working region away from the centre of the first magnet, effectively to project the working region outside the geometric confines of the first magnet. It also allows the first magnet to be designed in a manner which removes the close confinement of the working region in prior art systems and thereby allows the working region to be surrounded by free space.

The claustrophobia experienced by many MRI subjects can therefore be alleviated. However, importantly, the apparatus according to the present invention allows the manipulation of a patient subject's position with respect to the working region which is advantageous for "magic angle"

type observations and for positioning the part of the subject of interest directly within the most homogeneous part of the working region.

A major advantage of this invention is that it allows the expansion of the MRI technique from diagnosis into a tool for aiding medical interventions in real-time, such as surgical operations. It is envisaged that, with such a system, a surgeon may be able to operate upon part of a subject and obtain MRI images of that part, during the procedure, and without moving the patient.

Typically, the centres of the first and second magnets and the centre of the working region are each positioned upon a common axis since this simplifies the magnetic fields involved. Generally, one or each of the first and second magnets comprises one or more coils. This is particularly advantageous in the case of the first magnet where a large coil diameter can be effected, resulting in reduced field gradients in and near the location of the working region.

Preferably such a first magnet comprises a first coil in which the coil diameter is the largest of the dimensions defining the coil. This is therefore quite different from known tubular type systems.

As mentioned above, the invention provides the ability to perform imaging during real-time interventions since there is room for a person (such as a physician) to be positioned within the apparatus in addition to the subject (patient) during imaging. Typically, therefore the dimensions of the first coil are sufficient to permit at least one person to perform procedures upon part of the body of a subject containing the working region, when the apparatus is in use. It is also advantageous that the coil diameter is large with respect to the working region since this produces more modest gradients which are easier to handle. Preferably therefore, the first coil has a diameter of between about two metres and four metres. This also allows sufficient access for surgical interventions.

In order to provide simpler access in a practical environment such as a laboratory or hospital, preferably one or each of the first and second magnets comprises a coil defining a corresponding plane, and wherein the apparatus is arranged such that each plane so defined is angled with respect to the horizontal. This allows simpler access to the working region by a subject and/or one or more medical staff, since one or each of the coils may be angled with respect to the floor. Patients or staff may therefore simply walk into the apparatus from one side, or be wheeled in upon a bed. Typical angles for the coil plane with respect to the horizontal include 30, 45, 60 and 90 degrees. The choice of the particular angle used depends upon the application in question. Higher angles, particularly for the second magnet, allow more efficient use of the space beneath a subject and allow medical personal less restricted access to the subject. It is also desirable to place the coils of the second magnet close to the subject to maximise their efficiency. With a 90 degrees tilt, access from one side would be simple whereas the second magnet would prevent such access from the opposite side. However, this provides greater field homogeneity, particularly with regard to the size of the working region.

In the use of such apparatus for real-time medical interventions, MRI compliant materials should be used within the local vicinity. The apparatus also preferably further comprises a support (such as a bed) on which a subject is rested in use so as to position the working region within the body of the subject.

In order to obtain the required field strengths efficiently, one or each of the magnets preferably comprises superconducting magnets. At present, these materials require placement in low temperature environments in order to operate. Preferably, therefore, high temperature superconducting magnets are used. A further important practical advantage of a tilted system is that each of the first and second magnets can be placed in a common cryogenic tank without comprising access. This provides operational and cost benefits.

Some examples of apparatus for magnetic resonance imaging according to the present invention will now be described with reference to the accompanying drawings, in which:—

FIG. 3 shows a second example with the co-ordinate axes central to the centre of the working region;

FIG. 4 shows a third example with two correction coils;

FIG. 5 shows a fourth example;

FIG. 6 shows a fifth example;

FIG. 7 shows a sixth example;

FIG. 8 shows a seventh example;

Figure 1:
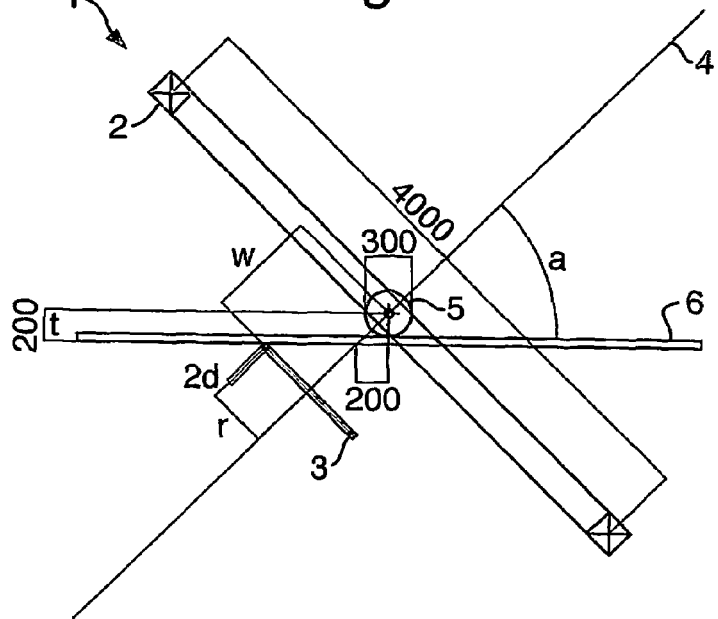
FIG. 1 shows the general arrangement of the coils according to the examples.

FIG. 1 shows a schematic diagram, partly in section, of a magnetic resonance imaging (MRI) apparatus 1 in accordance with the present invention. This comprises a first magnet in the form of a main coil 2. The main coil 2 in this case is in the form of a large flat ring, the diameter of the coil (between the central sections of opposing parts) is 4 metres with a height and width of the coil cross section itself being of the order of a few centimetres.

As shown in FIG. 1, a second magnet in the form of a correction coil 3, again taking the form of a flat ring, is positioned on a common axis 4 with respect to the main coil 2. The planes of the main and correction coils 2, 3 are arranged to be parallel with one another and the centres of the coils perpendicular to these planes are spaced by a set distance. In the example shown in FIG. 1, the coils 2 and 3 each have a square cross section, although this is not essential. In the description below the rectangular side lengths of the coil sections are denoted by "$2d$". Typically the shape and area of the coil cross-sections vary between different coils. The radius of the coils is denoted by a value "r" which simply provides the radial distance between the geometric centre of the coil and centre of its section. For the main coil 2 shown in FIG. 1, r is 2 metres.

In use, the main and correction coils produce magnetic fields resulting in a substantially homogenous region which is suitable for MRI. For each of the coils, a value "w"

represents the distance between the geometric centre of a particular coil and that of the homogenous region. The substantially homogenous region in FIG. 1 is shown at 5, having a diameter of 0.3 metres.

A support 6 is also provided, typically this being in the form of a table upon which a patient (subject) may rest. As shown, the support is typically positioned horizontally and is located 0.2 metres beneath the centre of the substantially homogenous region 5.

Since the planes of the coils in some examples are arranged at an angle with respect to the support 6 and/or a horizontal surface such as the floor, in FIG. 1, this angle is denoted by "a".

In the examples now described, the main coil which produces most of the field has a mean diameter of 4 metres and the space available for the correction coils is determined by the working region, the support thickness and the angle "a" between the support and the axis of the coils. These examples were generated according to the following methodology.

A range of suitable MRI systems, each consisting of four filamentary hoops was generated, in each case by minimising the following function:—

$$\sum_{n=1}^{4}\left(\frac{r_0^n}{n!}\sum_{i=0}^{3} N_i \cdot B_n(a_i, b_i)\right)^2$$

where $B_n(a_i,b_i)$ is the nth axial derivative of the field produced by a current loop whose radius is "a" and axial position is "b", and N is the number of ampere-turns in the loop.

The minimisation was performed with respect to $a_1, a_2, a_3, b_1, b_2, b_3, N_1, N_2, N_3$. It was assumed that $a_0=2$ m, $b_0=0$, and $N_0=1$. The parameters were subject to the conditions $b_i > (a_i + d) \cdot \cot(\alpha) + t \cdot \csc(\alpha)$.

All of the parameters were confined within practical ranges. The parameter, $r_0$ is a notional radius of the working volume and affects the sensitivity of the optimisation to the higher orders. Typically a value for $r_0$ in the range 0.05 m to 0.1 m was used.

The minimisation software used steps down the "steepest slope" in the space of the parameters until one of four conditions is met, these being:
1. The value of the error function is less than the specified value of accuracy. This is a true minimum;
2. Further progress into the minimum requires reducing the step size to a specified unrealistically small value. This is declared to be a "singularity";
3. The bottom of a valley is reached, but the error function has a value greater than the specified accuracy. This is declared as a "local minimum"; or
4. The boundary of the allowable space of parameters is reached and no further progress is possible.

In all of these cases, the parameters are reset to random values within the allowable space, and the process continues until one of the following events occurs:
i) A specified number of true minima have been found;
ii) A specified maximum number of steps has been performed; or
iii) The user interrupts the process.

In this way, provided that sufficiently large values for (i) and (ii) above have been set, the whole of parameter space will eventually be explored.

The output of the abovementioned software was input into evaluation software which calculates the individual and total gradients and the numbers of ampere-turns for the resultant systems. The result of this can then be scanned for likely candidate systems.

The next step was to convert the candidate systems of hoops into systems of "thick" coils. This is again done using the minimisation program, this time with the error function as below:

$$\sum_{n=1}^{4}\left(\frac{r_0^n}{n!}\sum_{i=0}^{3} B_n(a_{1i}, a_{2i}, b_{1i}, b_{2i}, J_i)\right)^2$$

where the derivatives are now functions of the inner a and outer b radii, of the positions of the ends and of the current density J. By setting close limits for the parameter values, the thick-coil equivalents of the hoops are obtained.

In practice, it was found easiest to perform the optimisation in several stages, these being:
a) Generate a set of candidate systems based on hoops, and choose the best in terms of homogeneity and ampere-turns;
b) Convert these into thick solenoids;
   (i) choose likely current densities based on approximate radius and likely peak field and optimise the homogeneity by varying $a_1, a_2, b_1, b_2$ with fixed current density;
   (ii) if this process results in overlapping coils, then attempt to resolve this by setting tighter limits on the radii, or by attempting to combine coils;
   (iii) choose the best of the results of the above and fine-tune the homogeneity by optimising with respect to the current densities; and
c) Analyse the results for peak fields and stresses, returning to b (i) if necessary.

A number of systems were designed according to the above methodology. These are described more fully below. In the following tables the units are tesla, metres, teslas per metre, pascals. In evaluating the homogeneity of these systems, it is useful to compare them with that of the main coil itself, these values being given in Table 1.

TABLE 1

|  | $B_0$ | $B_1$ | $B_2$ | $B_3$ | $B_4$ | total |
|---|---|---|---|---|---|---|
| derivs (tesla · m$^{-n}$) | 6.6629E−01 | 0.0000E+00 | −4.9926E−01 | 0.0000E+00 | 1.8703E+00 |  |
| δB at r = 0.1 m (ppm) |  | 0.00 | 3746.56 | 0.00 | 11.70 | 3758.26 |
| δB at r = 0.05 m (ppm) |  | 0.00 | 936.64 | 0.00 | 0.73 | 937.37 |

Figure 2:
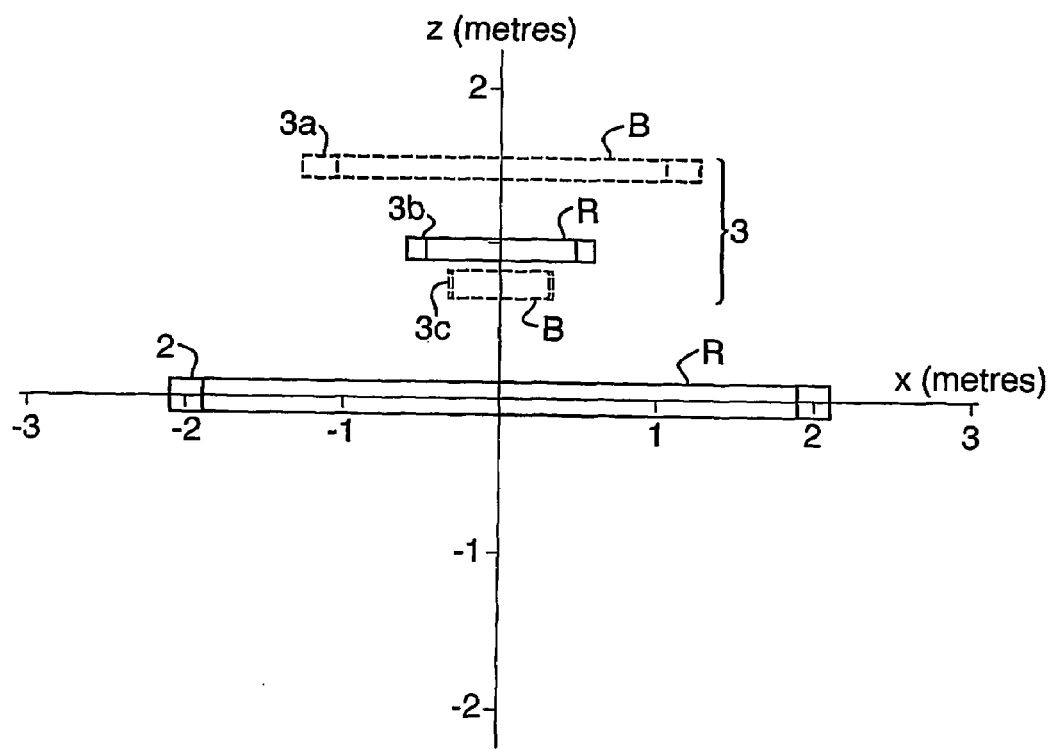
FIG. 2 shows a first example with a homogeneous region centred at the co-ordinate axes region, within the main coil.

A first example of a system according to the present invention is shown in FIG. 2. Here coordinate axes Z and X are shown. The main and correction coils 2,3 are arranged so as to have a common axis lying along the Z axis. It will be appreciated that although the X axis is indicated, the coils are symmetrical about the Z axis. It will also be noted that the origin of the coordinate axes lies at the centre of the main coil 2. In each of the following examples, the origin of the coordinate axes is arranged at the centre of the substantially homogeneous magnetic working region 5. As the invention relates primarily to the arrangement of the magnets, other conventional support apparatus used for MRI imaging such as cryogenic apparatus, radio frequency (RF) emitters and detectors, signal processing systems, control systems and so on, are not described further here although would be present in practice.

In this first example, the correction "coil" actually comprises three separate coils of various dimensions, these being labelled 3a, 3b, 3c. As indicated within FIG. 2, each of these coils have differing diameters and also have rectangular sections.

In use, electric current is arranged to flow in a particular sense in some coils, and in the opposite sense in others, this can be thought of as clockwise and anticlockwise. Coils in which the current flows in a first sense are each labelled "R", whereas those in which the current flows in the opposite sense with respect to the first sense, are indicated with "B".

Further details concerning the positioning of the coils, the corresponding magnetic fields and the hoop stresses generated within the coils during use, are given in Tables 2 and 3 below.

In each of the tables below, coils of finite current density are mainly described by a1, a2, b, w, J. Referring back to FIG. 1, r is the radius of the centroid of the coil section and d is a dimension which characterises the width of the section. However, in the tables a1 is the outer radius of the coil section, a2 is the inner radius and b defines the width of the coil section along the Z axis, centred about the distance w from the centre of the substantively homogenous region 5. The relationship between the column numbers and the coils shown in FIG. 2 can be determined by the distance "w" between the respective coil centre and the centre of the substantially homogeneous region 5.

This system produced a rather large third order in the magnetic field and a relatively large hoop stress in coil 3a.

In addition to the arrangement of the coils as described, in this example, the Z axis is angled to the horizontal by 45 degrees (a=45 degrees in FIG. 1). This allows easy access to the region 5 in which the substantially homogeneous magnetic field is produced.

Since the main coil 2 has a diameter of 4 metres, the subject may be positioned such that the area of interest within the subject's body is precisely within the most uniform part of the substantially homogeneous region. This is particularly advantageous for imaging off-axis parts of a subject such as the shoulders. In prior art systems it was necessary to produce a large enough substantially homogeneous region to encompass such an area. However, away from the centre of the region in such systems the field is less homogeneous than at the centre.

The angled arrangement, the diameter of the main coil and the position of the correction coils also allows one or more medical personnel to be present during imaging, which provides for real-time imaging during medical procedures and interventions such as surgery. In the examples described here, the fields produced in the working region 5 are sufficiently strong for such an application.

Tissue such as tendons can also be oriented at an angle for imaging due to the open-access nature of the system.

In a second example, in order to reduce the stress within the coil 3a, the system was redesigned based upon calculations using a reduced current density in that coil. The arrangement produced is shown in FIG. 3.

The coils 3a1, 3b1, 3c2 correspond to those labelled as 3a, 3b, 3c in FIG. 2. The reduction of the current density in coil 3c of the system of the first example resulted in a new system with coils 3b1 and 3c1 overlapping.

In a third example shown in FIG. 4, the coils 3b1 and 3c1 were replaced by a single coil 3b2, such that two correction coils 3a2,3b2 are provided. Tables 4 and 5 give further details of the system according to the third example.

TABLE 2

|  | 1 | 2 | 3 | 4 |
|---|---|---|---|---|
| J | 5.0000E+07 | 1.0832E+08 | −1.0673E+08 | −1.0786E+08 |
| $a_1$ | 1.8970E+00 | 4.8100E−01 | 1.0570E+00 | 3.1600E−01 |
| $a_2$ | 2.1030E+00 | 6.0800E−01 | 1.2780E+00 | 3.3700E−01 |
| b | 1.0300E−01 | 7.8000E−02 | 7.0000E−02 | 9.0000E−02 |
| w | 0.0000E+00 | 9.6000E−01 | 1.4860E+00 | 7.3400E−01 |
| max $B_{mod}$ | 4.061E+00 | 5.996E+00 | 7.552E+00 | 3.210E+00 |
| max $\sigma_h$ | 3.632E+08 | 2.979E+08 | 8.016E+08 | 1.268E+07 |
| min $\sigma_h$ | −3.042E+08 | −2.857E+08 | −6.931E+08 | −9.723E+07 |

TABLE 4

|  | 1 | 2 | 3 |
|---|---|---|---|
| J | 4.2676E+07 | 8.5696E+07 | −2.9878E+07 |
| $a_1$ | 1.8970E+00 | 3.2100E−01 | 1.0660E+00 |
| $a_2$ | 2.1030E+00 | 3.5100E−01 | 1.1850E+00 |
| b | 1.0300E−01 | 9.8000E−02 | 1.0800E−01 |
| w | 0.0000E+00 | 8.3400E−01 | 1.3110E+00 |
| max $B_{mod}$ | 3.496E+00 | 2.085E+00 | 1.587E+00 |
| max $\sigma_h$ | 2.675E+08 | 5.532E+07 | 4.758E+07 |
| min $\sigma_h$ | −2.196E+08 | −2.426E+07 | −5.205E+07 |

TABLE 3

|  | $B_0$ | $B_1$ | $B_2$ | $B_3$ | $B_4$ | total |
|---|---|---|---|---|---|---|
| derivs (tesla · m$^{-n}$) | 4.9276E−01 | −5.5686E−04 | 4.7420E−03 | 1.5219E+00 | −3.8496E−01 |  |
| δB at r = 0.1 m (ppm) |  | 112.84 | 48.11 | 514.76 | 3.26 | 678.96 |
| δB at r = 0.05 m (ppm) |  | 56.42 | 12.03 | 64.34 | 0.20 | 132.00 |

TABLE 5

|  | $B_0$ | $B_1$ | $B_2$ | $B_3$ | $B_4$ | total |
|---|---|---|---|---|---|---|
| derivs (tesla · m$^{-n}$) | 5.0000E−01 | 2.9227E−04 | −2.2737E−02 | 2.7199E+00 | 1.7736E+01 |  |
| δB at r = 0.1 m (ppm) |  | 58.86 | 227.34 | 906.62 | 147.80 | 1340.62 |
| δB at r = 0.05 m (ppm) |  | 29.43 | 56.83 | 113.33 | 9.24 | 208.83 |

Although this now has worse second and third order fields, its conservatism and simplicity make it of great interest practically. In this example the conductor requirement is $2.92 \times 10^7$ amp-m at 0.5 Tesla (of which the main coil represents $2.28 \times 10^7$ amp-m).

A fourth example of a system according to the invention is shown in FIG. 5. This has three correction coils $3a3$, $3b3$, $3c3$ as indicated. Further details are given in Tables 6 and 7.

TABLE 6

|  | 1 | 2 | 3 | 4 |
|---|---|---|---|---|
| J | 5.0000E+07 | −1.9683E+08 | −1.0185E+08 | 9.9476E+07 |
| $a_1$ | 1.8960E+00 | 6.9000E−02 | 1.0370E+00 | 4.0400E−01 |
| $a_2$ | 2.1040E+00 | 1.2700E−01 | 1.2080E+00 | 5.2300E−01 |
| b | 1.0400E−01 | 1.2500E−01 | 8.6000E−02 | 5.9000E−02 |
| w | 0.0000E+00 | 7.2500E−01 | 1.4700E+00 | 7.9431E−01 |
| max $B_{mod}$ | 4.115E+00 | 1.041E+01 | 6.980E+00 | 4.992E+00 |
| max $\sigma_h$ | 3.687E+08 | 1.392E+08 | 6.991E+08 | 1.914E+08 |
| min $\sigma_h$ | −3.060E+08 | −7.048E+07 | −5.975E+08 | −1.639E+08 |

TABLE 7

|  | $B_0$ | $B_1$ | $B_2$ | $B_3$ | $B_4$ | total |
|---|---|---|---|---|---|---|
| derivs (tesla · m$^{-n}$) | 4.9958E−01 | 4.1393E−05 | −1.0987E−03 | −2.1778E−02 | −3.2390E+01 |  |
| δB at r = 0.1 m (ppm) |  | 8.83 | 10.93 | 7.26 | 270.14 | 297.16 |
| δB at r = 0.05 m (ppm) |  | 4.41 | 2.73 | 0.91 | 16.88 | 24.94 |

The system of this example has good homogeneity. However, the stress in coil $3a3$ is again quite high, and the peak field in coil $3c3$ also ideally should have a lower current density. This system is however useful at a lower field, for example 0.25 Tesla.

Further details regarding the fifth example are provided in Tables 8, 9.

TABLE 8

|  | 1 | 2 | 3 | 4 |
|---|---|---|---|---|
| J | 5.0114E+07 | 1.0363E+08 | 1.0363E+08 | −9.0134E+07 |
| $a_1$ | 1.8960E+00 | 4.5252E−01 | 1.0270E+00 | 2.4700E−01 |
| $a_2$ | 2.1040E+00 | 5.8704E−01 | 1.2360E+00 | 3.7800E−01 |
| b | 1.0400E−01 | 9.6000E−02 | 8.6000E−02 | 9.6000E−02 |
| w | 0.0000E+00 | 8.3500E−01 | 1.4860E+00 | 8.3500E−01 |
| max $B_{mod}$ | 4.113E+00 | 8.178E+00 | 8.408E+00 | 7.404E+00 |
| max $\sigma_h$ | 3.689E+08 | 3.684E+08 | 8.847E+08 | 9.098E+07 |
| min $\sigma_h$ | −3.085E+08 | −2.351E+08 | −7.445E+08 | −2.385E+08 |

TABLE 9

|  | $B_0$ | $B_1$ | $B_2$ | $B_3$ | $B_4$ | total |
|---|---|---|---|---|---|---|
| derivs (tesla · m$^{-n}$) | 4.8115E−01 | −1.7586E−04 | −1.0104E−01 | −7.9486E−01 | −2.8690E+01 |  |
| δB at r = 0.1 m (ppm) |  | 3.65 | 1049.98 | 275.33 | 248.45 | 1577.42 |
| δB at r = 0.05 m (ppm) |  | 1.83 | 262.50 | 34.42 | 15.53 | 314.27 |

A fifth example system is shown in FIG. 6. In this example the angle of the Z axis with the horizontal is 60 degrees (therefore a=60 degrees in FIG. 1). However, in FIG. 6, the Z axis is arranged upright as in the other figures.

In this case three correction coils are provided, indicated at $3a4$, $3b4$, $3c4$.

Again there is a high stress in coil $3a4$. To alleviate this one or more of, a lower current density, a thicker coil section or a lower field can be used.

A sixth example is shown in FIG. 7 with Tables 10 and 11 providing further details. Here 3 correction coils are used and in this particular case, the coil $3b5$ (having current flowing in the same sense as the main coil 2) is closer to the centre of the working region 5 than the other correction coils 3$a$5, 3$c$5.

TABLE 10

| | 1 | 2 | 3 | 4 |
|---|---|---|---|---|
| J | 5.0000E+07 | −9.0595E+07 | −1.0462E+08 | 9.9454E+07 |
| $a_1$ | 1.8940E+00 | 8.5000E−01 | 9.4100E−01 | 6.9800E−01 |
| $a_2$ | 2.1070E+00 | 9.6000E−01 | 1.1150E+00 | 8.5400E−01 |
| b | 1.0700E−01 | 5.3000E−02 | 8.7000E−02 | 7.9500E−02 |
| w | 0.0000E+00 | 7.8400E−01 | 1.0070E+00 | 7.0800E−01 |
| max $B_{mod}$ | 4.271E+00 | 9.801E+00 | 7.444E+00 | 1.002E+01 |
| max $\sigma_h$ | 3.817E+08 | 6.678E+08 | 6.955E+08 | 2.696E+08 |
| min $\sigma_h$ | −3.111E+08 | −1.912E+07 | −5.961E+08 | −7.296E+08 |

TABLE 11

| | $B_0$ | $B_1$ | $B_2$ | $B_3$ | $B_4$ | total |
|---|---|---|---|---|---|---|
| derivs (tesla · m$^{-n}$) | 4.9844E−01 | 2.9388E−05 | 5.1559E−04 | 1.5828E−01 | −1.4625E+01 | |
| δB at r = 0.1 m (ppm) | | 5.90 | 5.17 | 52.93 | 122.26 | 186.25 |
| δB at r = 0.05 m (ppm) | | 2.95 | 1.29 | 6.62 | 7.64 | 18.50 |

This system shows good homogeneity but does exhibit high stress and a high field in coil 3$b$5. It is more suitably used as a 0.35 T system for this reason. At this field strength, the conductor requirement is 4.7×10$^7$ amp-m.

A seventh example is shown in FIG. 8. Again, of the three correction coils 3$a$6, 3$b$6, 3$c$6, the coil 3$b$6 is closest to the centre of the substantially homogeneous working region 5. Tables 12 and 13 provide further details.

TABLE 12

| | 1 | 2 | 3 | 4 |
|---|---|---|---|---|
| J | 5.0000E+07 | 1.0510E+08 | −1.0406E+08 | −1.0893E+08 |
| $a_1$ | 1.9010E+00 | 4.5000E−01 | 5.9000E−01 | 1.1600E−01 |
| $a_2$ | 2.0990E+00 | 6.5700E−01 | 7.7400E−01 | 3.3600E−01 |
| b | 9.9000E−02 | 5.5000E−02 | 7.7000E−02 | 9.0000E−02 |
| w | 0.0000E+00 | 6.9100E−01 | 8.7200E−01 | 1.0020E+00 |
| max $B_{mod}$ | 3.935E+00 | 9.439E+00 | 7.043E+00 | 1.455E+01 |
| max $\sigma_h$ | 3.534E+08 | 2.103E+08 | 3.862E+08 | 1.888E+08 |
| min $\sigma_h$ | −2.903E+08 | −3.111E+08 | −3.527E+08 | −7.696E+07 |

TABLE 13

| | $B_0$ | $B_1$ | $B_2$ | $B_3$ | $B_4$ | total |
|---|---|---|---|---|---|---|
| derivs (tesla · m$^{-n}$) | 5.0430E−01 | −1.4837E−04 | 4.8474E−04 | 3.3527E−01 | −2.4768E+01 | |
| δB at r = 0.1 m (ppm) | | 29.91 | 4.71 | 110.79 | 204.64 | 350.06 |
| δB at r = 0.05 m (ppm) | | 14.95 | 1.18 | 13.85 | 12.79 | 42.77 |

This system has more tolerable stresses but has a high field in coil 3$a$6. It is appropriate as a 0.25 T system.

From the above examples resulting from the calculations, it can be seen that homogeneities of the order of 200 ppm over a 20 cm dsv (diameter of the sensitive volume, that is "working region") and 20 ppm over 10 cm dsv are achievable, which is suitable for MRI imaging. Field strengths of at least 0.25 to 0.35 Tesla are realisable with these systems.

A further, eighth, example of a system according to the present invention is now described. Unlike in the above examples, in this, case the working region 5, in which a substantially homogeneous (uniform) magnetic field is generated, is not co-located at the centre of the main coil 2. Rather, the centre of the homogeneous region 5 is displaced along the Z axis between the main and correction coils 2,3. This is illustrated in FIGS. 9 to 11.

Figure 9:
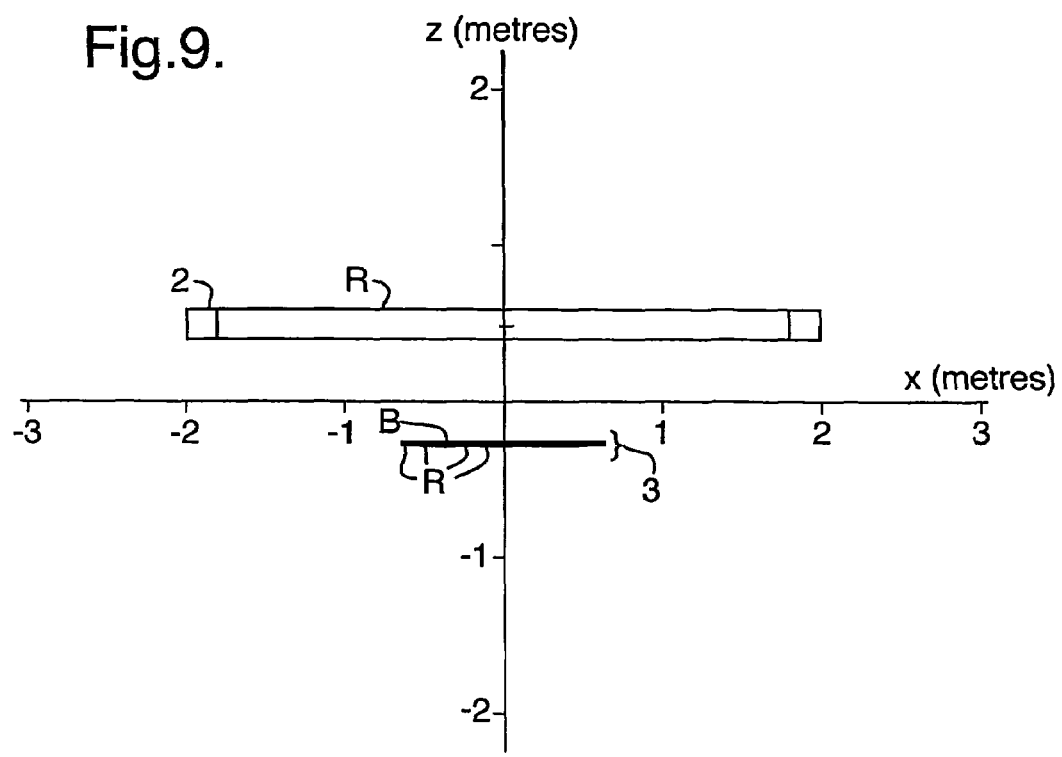
FIG. 9 shows an eighth example with the working region lying between the main and correction coils.

FIG. 9 shows the main and correction coils when viewed from the side in a similar manner to the earlier examples. It will be noted in this case that the main coil lies "above" the correction coils. As earlier, the origin of the axes marks the position of the centre of the working region 5. The main coil 2 is again in the form of a ring having a diameter of 4 metres. In this case five correction coils 3 are positioned beneath the main coil 2 upon a common axis Z. Each of the correction coils is of smaller diameter than the main coil 2 and has a small cross section. The correction coils are arranged approximately concentrically and are approximately regularly spaced in radial dimension.

Figure 10:
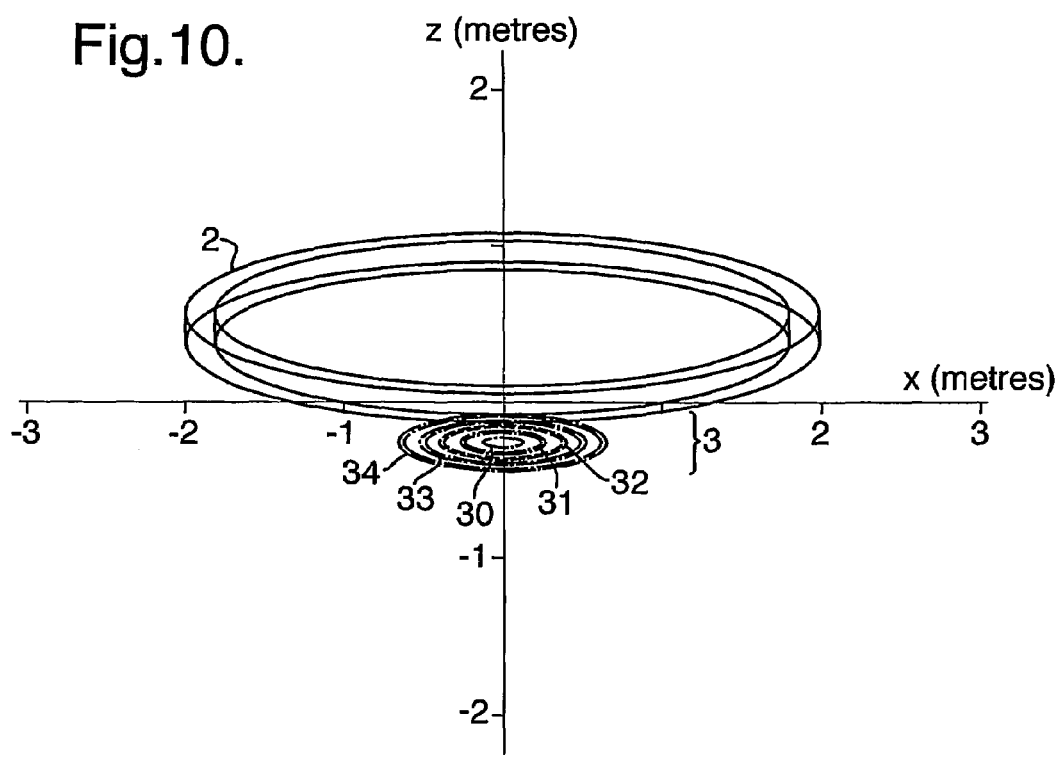
FIG. 10 shows a perspective view of the eighth example.

FIG. 10 is a perspective view from a position such that the Z axis is tipped out of the plane of the figure. The circular shape of the coils is therefore visible, as are the individual correction coils, denoted 30,31,32,33,34. Of these, only the middle coil 32 within the set, has current passing through the coil in an opposite sense to the main coil 2. The other correction coils have currents running in a manner similar to the main coil 2.

Figure 11:
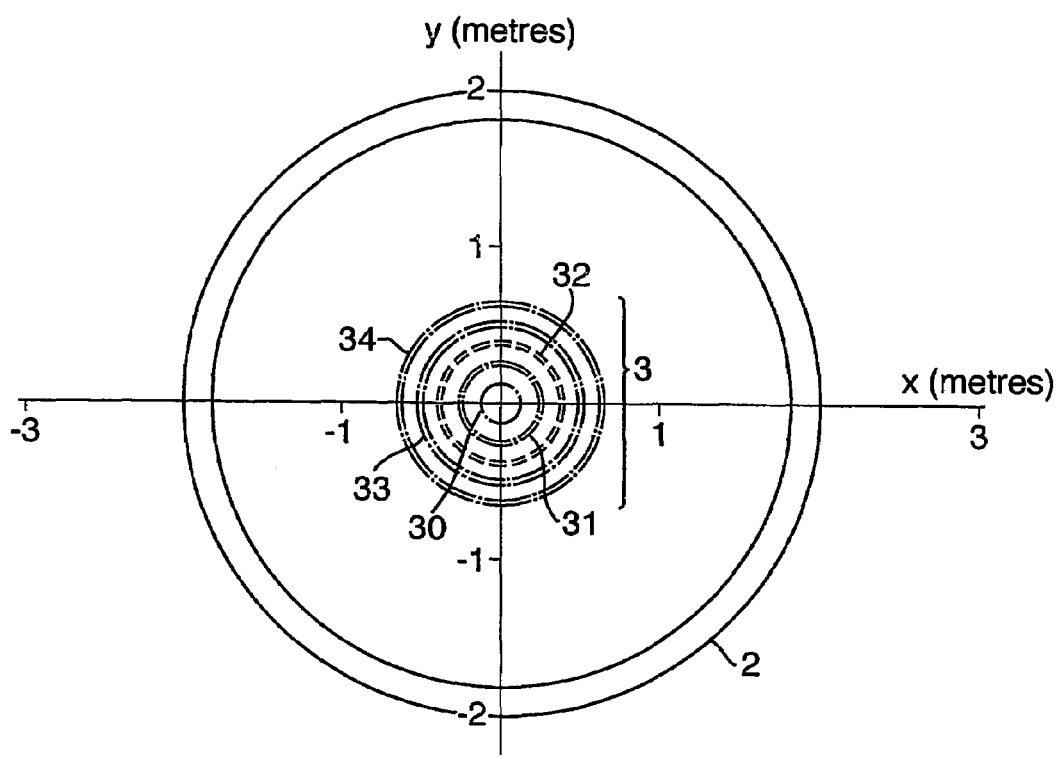
FIG. 11 shows the coils of the eighth example when viewed along the Z axis.

FIG. 11 shows a view of the example along the Z axis. Tables 14 and 15 provide further details of the eighth example.

TABLE 14

| | 1 | 2 | 3 | 4 | 5 | 6 |
|---|---|---|---|---|---|---|
| J | 5.0000E+07 | 9.9315E+07 | 9.0467E+07 | −1.0472E+08 | 9.8006E+07 | 1.0726E+08 |
| $a_1$ | 1.4440E+00 | 1.0000E−01 | 2.0000E−01 | 3.0300E−01 | 3.9200E−01 | 5.0300E−01 |
| $a_2$ | 1.5960E+00 | 1.0400E−01 | 2.1000E−01 | 3.1700E−01 | 4.1800E−01 | 5.1700E−01 |
| b | 7.6000E−02 | 2.0000E−03 | 4.0000E−03 | 6.0000E−03 | 1.1000E−02 | 8.0000E−03 |
| w | −4.0000E−01 | 2.0300E−01 | 2.0500E−01 | 2.1000E−01 | 2.1500E−01 | 2.1500E−01 |

TABLE 14-continued

|  | 1 | 2 | 3 | 4 | 5 | 6 |
|---|---|---|---|---|---|---|
| max $B_{mod}$ | 3.019E+00 | 6.414E-01 | 7.737E-01 | 1.047E+00 | 1.364E+00 | 9.111E-01 |
| max $\sigma_h$ | 2.060E+08 | 6.288E+06 | 1.365E+07 | -3.480E+06 | 5.033E+07 | 4.702E+07 |
| min $\sigma_h$ | -1.697E+08 | 3.855E+06 | 4.289E+06 | -3.371E+07 | -9.043E+06 | -8.950E+06 |

TABLE 15

|  | $B_0$ | $B_1$ | $B_2$ | $B_3$ | $B_4$ | total |
|---|---|---|---|---|---|---|
| derivs (tesla · $m^{-n}$) | 5.0002E-01 | -4.7658E-05 | -1.7628E-05 | 2.7865E-03 | 4.3287E-02 |  |
| δB at r = 0.1 m (ppm) |  | 9.53 | 0.18 | 0.93 | 0.36 | 11.0 |
| δB at r = 0.05 m (ppm) |  | 4.77 | 0.04 | 0.12 | 0.02 | 4.95 |

The effect of the system according to this example is to substantially reduce the amount of cancellation necessary for the odd-order gradients in the magnetic field, and to move the correction coils closer to the field centre. In consequence, the correction coils are subject to lower fields and forces and so the system is more economical. The system shown according to the eighth example has six coils and this allows fourth order gradients to be cancelled so that the system can be somewhat smaller to achieve the same sized working region 5.

Figure 12:
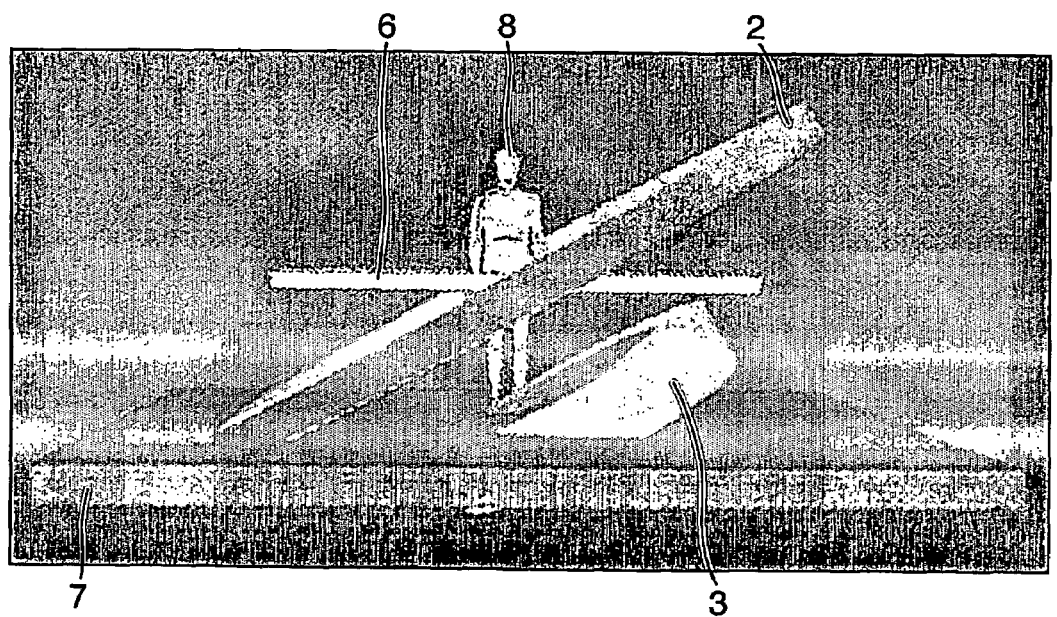
FIG. 12 illustrates a practical use of tilted coils according to any of the first to seventh examples.

FIG. 12 shows an illustration of how a titled system such as that described in accordance with the fifth example can be used in practice. The main and correction coils 2,3 are shown, spaced apart, with a horizontal support 6 being positioned such that a subject lying upon the support has part of their body located at the geometric centre of the working region 5 (and the main coil 2 in this example). The correction coils 3 are partially sunken into the floor 7, as is one extreme end of the main coil 2. This allows for easy access to the working region 5 and the support 6. A figure representing one or more medical personnel is shown at 8 and it can be seen that such personnel can easily become positioned as indicated by entering the apparatus from the left of FIG. 12.

Figure 13:
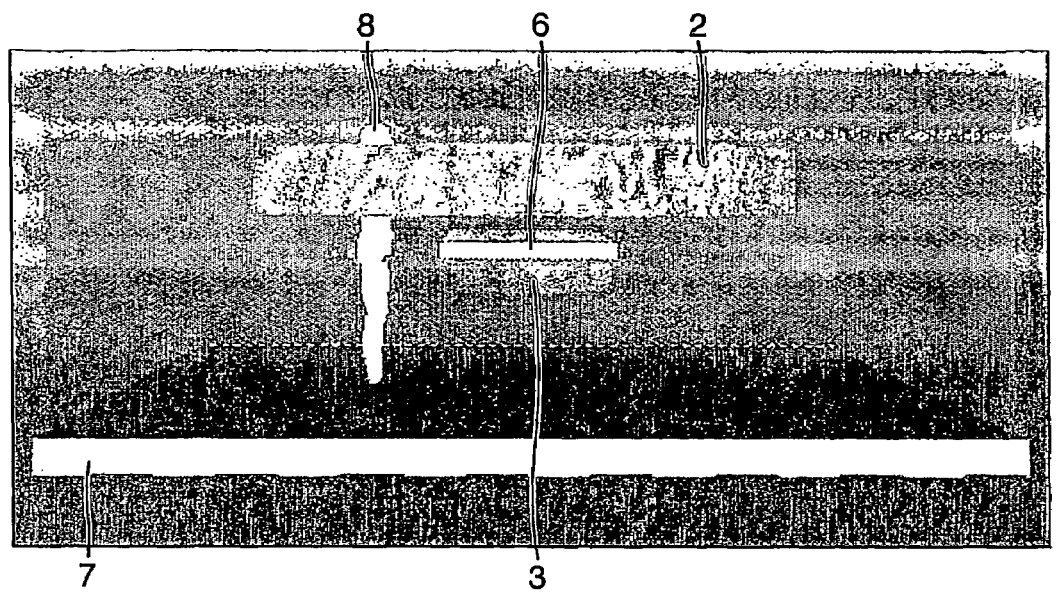
FIG. 13 illustrates a practical use of coils according to the eighth example.

FIG. 13 illustrates a non-tilted system in accordance with the eighth example. Here the support 6 (in the form of a bed) is viewed from one end. The main coil 2 is provided at approximately the level of the upper chest of the medical personnel (allowing access by ducking under it). It can be seen that the working region lies upon the axis between the main 2 and correction coils 3, with the correction coils being positioned just beneath the support 6.

Figure 14:
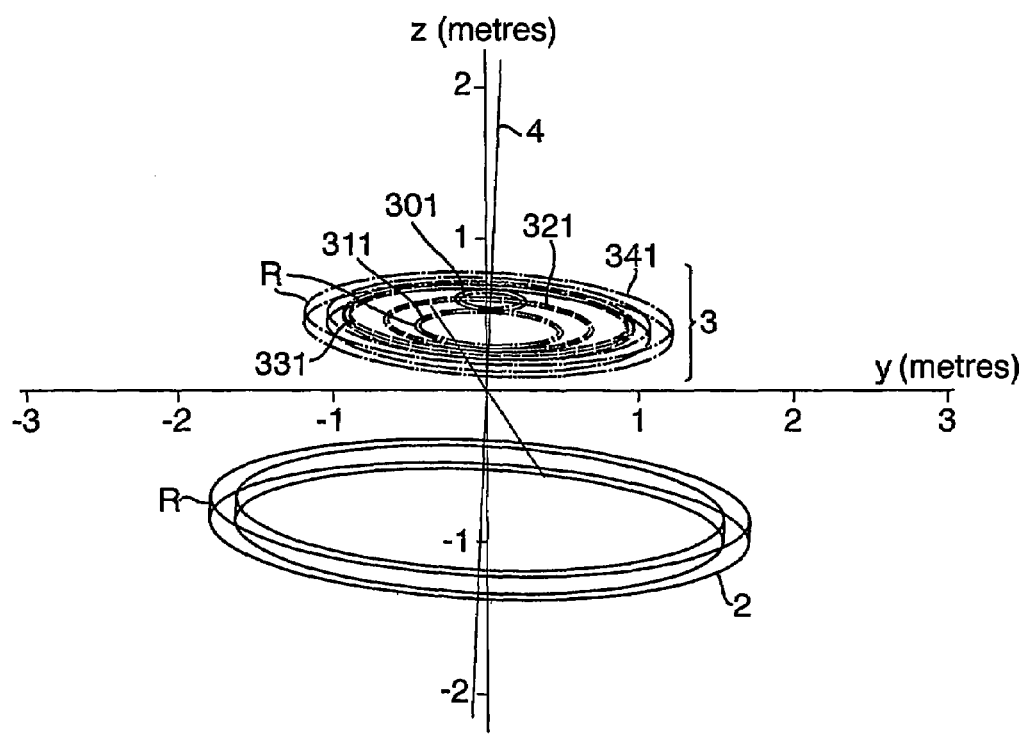
FIG. 14 shows the coil arrangement according to a ninth example.

A further, ninth, example is shown in FIG. 14. A main coil 2 is this time positioned beneath the origin of the co-ordinate axes (centred upon the working region 5). A set of correction coils 3 (totalling five in number) are provided above the origin. Four of these are approximately coplanar being centred at about 0.42 to 0.47 metres above the coordinate axes origin. Each of the coils is again arranged about a common axis 4 which, in FIG. 14, is tilted with respect to the Z axis in order to show the form of the coils.

The fifth coil is positioned slightly above the other four coils at a distance of about 0.62 metres above the origin. This coil is labelled as 301, with the remaining coils being denoted as 311, 321, 331, and 341 as indicated in FIG. 14. Of these coils 301, 311, 341 and the main coil 2 each have current running within them in the same sense, with the current flowing in the opposite sense within coils 321 and 331.

In this example, the system is tilted by an angle of 60 degrees from the vertical (that is, a=30 degrees with respect to FIG. 1). The main and correction coils 2, 3 are indicated, as is the support 6 upon which a subject lies in order to perform MRI. The working region is indicated at 5, positioned slightly above the support 6. This is shown more clearly in FIG. 15.

Figure 15:
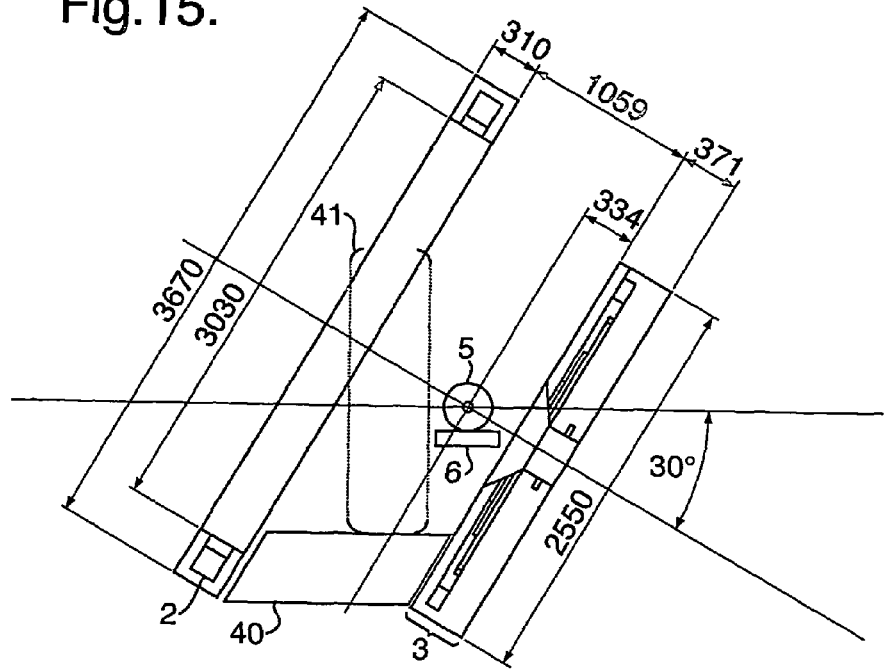
FIG. 15 shows the tilted arrangement of the ninth example.

FIG. 15 shows the coils installed within a room having a floor 40 (indicated in FIG. 15). Adjacent the support 6 is a region 41 within which one or more medical personnel are positioned during the operation of the system so as to perform interventions or procedures with respect to a subject lying upon the support 6.

It will also be noted in this example that the support 6 is elongate in a direction normal to the plane of the Figure (that is normal to the z axis). The subject is therefore arranged end on with respect to FIG. 15. This arrangement provides a high level of open access which is particularly advantageous when combined with the large substantially homogeneous region resulting from the coil arrangement.

Figure 16:
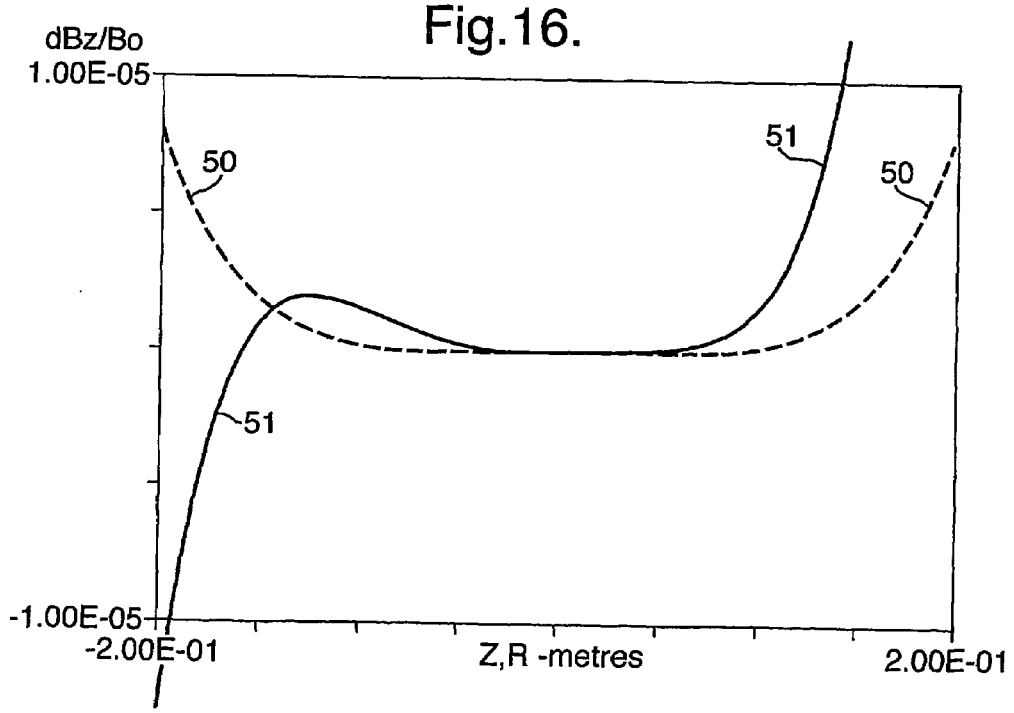
FIG. 16 shows axial and radial $dB_z/B_0$ field gradients for the ninth example.

FIG. 16 shows the variation in the field gradient $dB_z/B_0$ in the axial (Z axis) and radial direction. The radial trace is shown at 50 with the axial shown at 51 in FIG. 16. It can be seen that a substantially zero field gradient is produced over a large distance centred about the axis 4 of the system.

Figure 17:
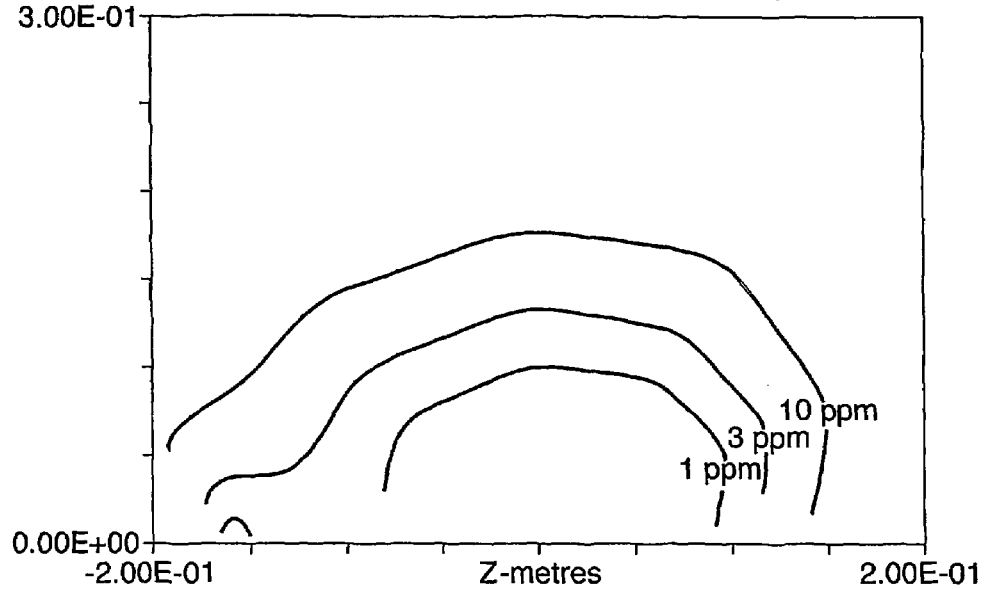
FIG. 17 shows the field homogeneity of the ninth example.

FIG. 17 shows the substantial homogeneity of the combined magnetic fields, resulting from the first and second magnets. It should be noted that the field inhomogeneities of one, three and ten parts per million (ppm) are each suitable for forming MRI imaging and therefore a large working region can be defined with high homogeneity at its centre.

Figure 18:
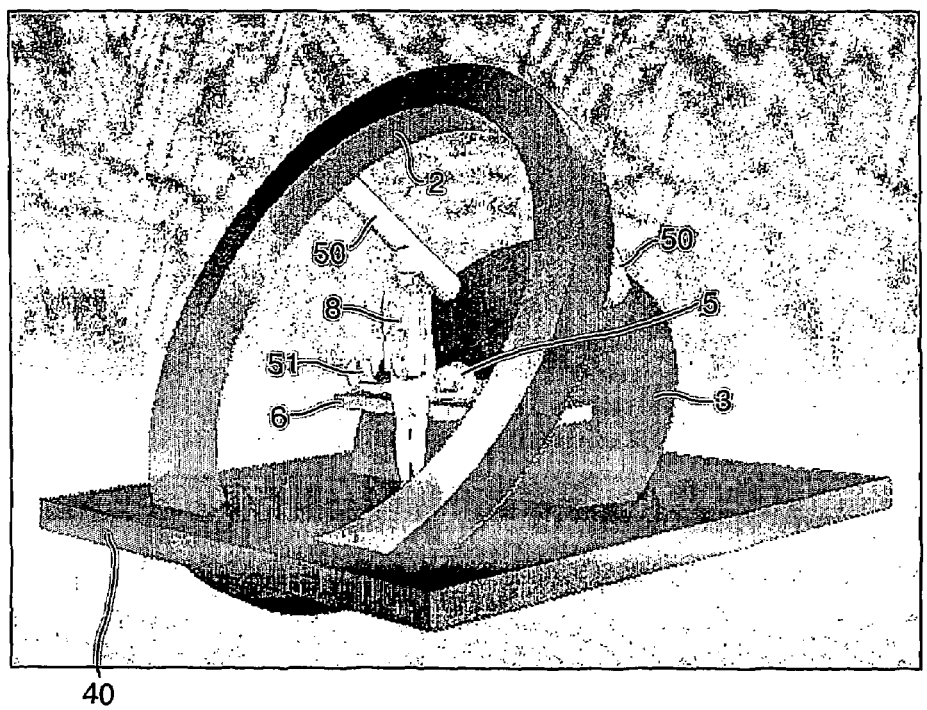
FIG. 18 illustrates a practical use of the tilted coils of the ninth example.

FIG. 18 is a schematic illustration of how such a tilted system may be used in practice. As in the previous example of FIG. 12, the axis 4 is tilted with respect to the vertical such that parts of the main and correction coils 2, 3 are embedded in the floor 40. An operator 8 representing one or more medical personnel is positioned within the region 41 shown in FIG. 15. As described earlier, the support table 6 is positioned laterally with respect to the main and correction coils such that the medical personnel can enter the system by walking through the main coil 2 to approach the support 6 (extending laterally with respect to the direction of approach).

The correction coils 3 are therefore positioned behind the support 6. The substantially homogenous working region 5 is also indicated in FIG. 18.

Support struts 50 along with part of the floor 40 support the respective forces caused by the interaction of the magnetic fields acting upon the respective main and correction coils 2, 3.

Further details of the system according to this example are provided in tables 16 and 17. Table 16 provides details of the dimensions of the coils in a similar manner to the previous examples with J being the current density in the amps per square metre. The row entitled "Amp-m" relates to the amount of superconducting material required for each coil. The peak magnetic field, axial force and minimum and maximum hoop stresses are also provided.

Table 17 shows magnetic field derivatives of $n^{th}$ order where n is an integer from zero to 8. These are provided for the radial ($B_r$), tangential ($B_\theta$) and axial ($B_z$) components, with the sum ($B_{mod}$) also set out.

This example therefore provides a particular advantage since open access is provided not only to the subject but also to the medical personnel because the correction coils 3 are positioned behind the support table 6.

Furthermore, by engineering the working region to be between the main and correction coils, the gradients from these respective coils cooperate more favourably so as to produce a large homogenous working region 5. The nest of correction coils can therefore be placed closer to the support 6 which is beneficial in the number of ampere turns needed for a given combined field intensity and homogeniety.

Whilst the description above has mainly described the use of a main coil of 4 metres in diameter, it will be appreciated that other diameters may be used. Similarly the drawings indicate variations in the sections of the coils. These are indicated as square or rectangular although other cross-sectional forms may be implemented.

It should be noted that it is also possible to add an additional coil of a larger diameter lying coplanar with the main coil 2 so as to provide active shielding by the use of a counter running current. The other coils could be similarly actively shielded to reduce external fields.

TABLE 16

| | Coil | | | | | |
|---|---|---|---|---|---|---|
| | 1 | 2 | 3 | 4 | 5 | 6 |
| a1 | 1.59 | 0.223 | 0.461 | 0.667 | 0.907 | 1.062 |
| a2 | 1.76 | 0.235 | 0.473 | 0.675 | 0.947 | 1.2 |
| b | 0.08 | 0.012 | 0.01 | 0.012 | 0.02 | 0.04 |
| z | −0.88 | 0.618 | 0.419 | 0.447 | 0.474 | 0.451 |
| J | 4.00E+07 | 1.05E+08 | 9.58E+07 | −1.06E+08 | −9.38E+07 | 6.00E+07 |
| amp-m | 1.15E+07 | 4.34E+04 | 6.74E+04 | 8.54E+04 | 8.74E+05 | 4.71E+06 |
| Peak fields (tesla) | 2.638 | 1.076 | 0.9822 | 0.9152 | 2.362 | 2.792 |
| Axial force (newtons) | 3.74E+05 | −1.45E+03 | −2.52E+03 | 5.92E+03 | 1.38E+05 | −5.14E+05 |
| Maximum hoop stress (pascals) | 1.58E+08 | 2.44E+07 | 4.21E+07 | −5.82E+06 | 2.58E+07 | 1.67E+08 |
| Minimum hoop stress (pascals) | −1.30E+08 | −9.41E+05 | 1.07E+06 | −6.34E+07 | −2.02E+08 | −1.11E+08 |

TABLE 17

| Order | Br | Btheta | Bz | Bmod |
|---|---|---|---|---|
| 0 | 0.00E+00 | 0.00E+00 | 5.12E−01 | 5.12E−01 |
| 1 | 0.00E+00 | 0.00E+00 | 5.37E−07 | 5.37E−07 |
| 2 | 0.00E+00 | 0.00E+00 | 4.44E−05 | 4.44E−05 |
| 3 | 0.00E+00 | 0.00E+00 | −4.38E−03 | −4.38E−03 |
| 4 | 0.00E+00 | 0.00E+00 | 1.35E−01 | 1.35E−01 |
| 5 | 0.00E+00 | 0.00E+00 | 7.74E+00 | 7.74E+00 |
| 6 | 0.00E+00 | 0.00E+00 | −1.31E−01 | −1.31E−01 |
| 7 | 0.00E+00 | 0.00E+00 | 2.16E+03 | 2.16E+03 |
| 8 | 0.00E+00 | 0.00E+00 | 7.73E+04 | 7.73E+04 |

The invention claimed is:

1. An apparatus for magnetic resonance imaging, comprising:

a first magnet for generating a first magnetic field; and a second magnet for generating a second magnetic field, dissimilar to the first magnetic field, the second magnet being spaced apart from the first magnet, wherein each of the first and second magnets comprise one or more coils, the apparatus being arranged such that the first and second magnets cooperate to generate a substantially homogeneous magnetic field defining a working region, wherein the first and second magnetic fields are arranged asymmetrically with respect to the working region, wherein at least part of the working region is positioned within the first magnet or between the first and second magnets, and wherein the coils of the first and second magnets define corresponding planes, the apparatus being arranged such that each plane so defined is angled with respect to the horizontal and part of the first magnet coils are sunk into the floor of a location in which the apparatus is situated, the dimensions of the first magnet coils being sufficient to permit at least one person to approach the working region by walking through the first magnet coils and for said person to perform procedures upon a part of the body of a subject contained in the working region, when the apparatus is in use.

2. The apparatus according to claim 1, adapted in use such that electrical current is caused to flow in a first sense in each of first magnet coils, and wherein the current is caused to flow in the first sense in at least one of the coils of the second magnet and in a second sense, opposite to the first, in at least one of the other coils of the second magnet.

3. The apparatus according to claim 1, wherein the first magnet generates a main magnetic field and the second magnet generates a correction magnetic field.

4. The apparatus according to claim 1, wherein the first and second magnets are spaced apart so as to define a volume, the centers of the first and second magnets being positioned at the boundaries of the volume and wherein at least part of the working region is positioned within the volume.

5. The apparatus according to claim 4, wherein the center of the working region lies within the region defining the volume.

6. The apparatus according to claim 1, wherein the second magnet is positioned only to one side of the working region.

7. The apparatus according to claim 1, wherein the first magnet is positioned only to one side of the working region.

8. The apparatus according to claim 1, wherein the first magnet is provided only to a first side of the working region and wherein the second magnet is provided only to a second side of the working region, the second side being opposed to the first side with respect to the working region.

9. The apparatus according to claim 1, wherein the center of the working region is positioned at the center of the first magnet.

10. The apparatus according to claim 1, wherein one or both of the first or second magnetic fields is asymmetrical with respect to the first or second magnet, respectively.

11. The apparatus according to claim 1, wherein the combined first and second magnetic fields produce a resultant magnetic field which is asymmetrical with respect to the working region and/or one or both of the first or second magnets.

12. The apparatus according to claim 1, wherein the field asymmetry is geometric asymmetry in one or more of the magnetic field strength, direction or gradient.

13. The apparatus according to claim 1, wherein the centers of the first and second magnets, and the center of the working region are positioned upon a common axis.

14. The apparatus according to claim 13, wherein the first coil diameter is the largest of the dimensions defining the coil.

15. The apparatus according to claim 14, wherein the first coil has a diameter of at least 2 meters.

16. The apparatus according to claim 15, wherein the first coil has a diameter of between 2 and 4 meters.

17. The apparatus according to claim 1, wherein the angle with respect to the horizontal is one of 30, 45, 60 or 90 degrees.

18. Apparatus according to claim 17, wherein the angle with respect to the horizontal is less than 90 degrees and wherein the apparatus is arranged such that the first magnet comprises a main coil, through which the working region is accessed for use in an access direction, and wherein the second magnet comprises one of more correction coils positioned behind the working region in the access direction.

19. The apparatus according to claim 18, further comprising a support upon which a subject is rested in use so as to position at least part of the body of the subject within the working region.

20. Apparatus according to claim 19, wherein the support is elongate in an elongate direction, the elongate direction being substantially normal to the access direction.

21. The apparatus according to claim 1, wherein one or both of the magnets comprise superconducting magnets.

22. The apparatus according to claim 21, wherein the superconducting magnets are high temperature superconducting magnets.

23. The apparatus according to claim 1, further comprising one or more additional magnets for providing active shielding of the apparatus when in use.

* * * * *